United States Patent [19]

Arce

[11] 4,142,142

[45] Feb. 27, 1979

[54] HIGH VOLTAGE A.C. TEST SET FOR MEASURING TRUE LEAKAGE CURRENT

[75] Inventor: Luis A. Arce, Lakewood, Calif.

[73] Assignee: G. L. Collins Corporation, Long Beach, Calif.

[21] Appl. No.: 767,207

[22] Filed: Feb. 9, 1977

[51] Int. Cl.² .................... G01R 31/02; G01R 31/12; G01R 27/00

[52] U.S. Cl. ........................................ 324/54; 324/62

[58] Field of Search ................... 324/54, 51, 62, 65 R; 340/248 R, 248

[56] References Cited

U.S. PATENT DOCUMENTS

| | | | |
|---|---|---|---|
| 2,916,697 | 12/1959 | Boode | 324/54 |
| 2,977,531 | 3/1961 | Humes et al. | 324/54 |
| 3,040,249 | 6/1962 | Schwarckopf et al. | 324/54 |
| 3,201,776 | 8/1965 | Morrow et al. | 340/248 R X |
| 3,227,953 | 1/1966 | Cerveny | 324/62 R X |
| 3,286,130 | 11/1966 | Clinton | 324/54 X |
| 3,399,399 | 8/1968 | Apfelbaum | 340/248 R X |
| 3,678,376 | 7/1972 | Jaster et al. | 324/54 |
| 3,777,259 | 12/1973 | Clinton | 324/62 |
| 3,914,687 | 10/1975 | Bevins | 324/51 |

FOREIGN PATENT DOCUMENTS 910045   11/1962   United Kingdom ...................... 324/51

OTHER PUBLICATIONS

Carlson, Elmer C., "Semiconductor Circuit Tester . . . Model 250," Radio-Electronics, vol. 36, No. 4, Apr. 1965, p. 70.

Primary Examiner—Gerard R. Strecker
Attorney, Agent, or Firm—Lyon & Lyon

[57] ABSTRACT

High voltage testing apparatus producing A.C. test voltages across test probes produces electrical indications truly representative of only resistance in-phase currents flowing through a device being tested even though such device may be capacitive in addition to resistive in nature. Eliminated from such indications are effects otherwise due to quadrature capacitive currents. A transistor is connected between the test probes and is rendered alternatively conductive and nonconductive during succeeding half cycles of the A.C. voltage and such transistor is connected in conjunction with a meter which "samples" the voltage appearing between the test probes only during a first half cycle of the A.C wave during which the positive and negative portions of the quadrature capacitive current average out to a zero flow and thus have no effect on the meter. During the second half cycle of the A.C. wave the meter is effectively short-circuited by the transistor and is thus rendered insensitive.

9 Claims, 2 Drawing Figures

HIGH VOLTAGE A.C. TEST SET FOR MEASURING TRUE LEAKAGE CURRENT

The present invention relates to improved means and techniques useful in high voltage testing of electrical devices.

High voltage testing is essentially proof testing and prescribed by some agencies such as, for example, the Military and the Underwriters Laboratory as a safety measure and is accomplished by applying an over voltage in excess of normal operating voltages between "live" parts to electrically stress the insulating materials and reveal defects of both insulating materials or workmanship.

Electrical devices by virtue of the fact that they are of metal and have associated metal parts such as, for example, a metal chassis exhibit what is called an "inherent capacitative effect" which manifests itself as a current flow when an A.C. test voltage is applied during testing for resistive leakage. The current flow due to capacity is in quadrature to that in-phase current which is due to resistance. In some cases the quadrature leakage current is greater than the current flow through the high resistance of the insulation.

Conventional high voltage testing apparatus involves applying an over voltage to the apparatus for measuring resulting currents and no distinction is made between that current which is due to the inherent capacitance or how much is due to the insulation resistance of the apparatus. Some more sophisticated testing equipment have means for producing a "canceling effect" so as to mask the effect of the so-called "inherent capacitance" and in such testing equipment a variable capacitor is used which requires adjustment on each test to "tune out" the quadrature capacitance current in order to obtain an indication which is solely a resistive leakage current.

A feature of the present invention is that the in-phase leakage current which is due essentially solely to resistive leakage is truly indicated without the need to "tune out" the leakage capacitance.

It is therefore an object of the present invention to provide improved high voltage testing equipment in which indications are produced truly indicative of resistive leakage effects.

Another object of the present invention is to provide an improved testing apparatus of this character which does not require auxiliary adjustments to eliminate the effect of quadrature capacitive currents.

Another object of the present invention is to provide an arrangement which is readily adaptable to existing testing equipment to achieve the new and improved results of the present invention.

The features of the present invention which are believed to be novel are set forth with particularity in the appended claims. This invention itself, both as to its organization and manner of operation, together with further objects and advantages thereof, may be best understood by reference to the following description taken in connection with the accompanying drawings in which:

Figure 1:
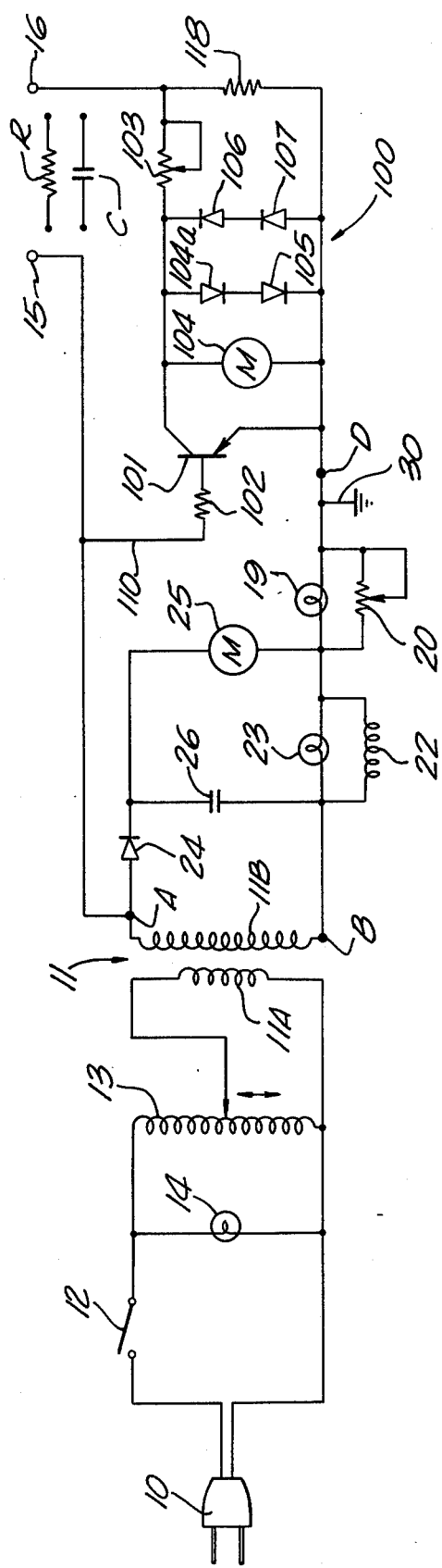
FIG. 1 is a schematic diagram of a measuring system embodying the present invention.

Referring to FIG. 1, the device illustrated is powered by a commercial 115 volt 60 cycle source using conventional plug 10 which is illustrative of such voltage source. The terminals of plug 10 are connected to opposite terminals of the primary winding 11A of transformer 11 through an on-off switch 12 and a voltage control 13 which is in the nature of a tapped auto-transformer. A lamp 14 connected across auto-transformer 13 indicates the energized condition of the device.

The secondary winding 11B of transformer 11 has one of its terminals A connected to the high-frequency probe 15, the other probe 16 being connected to the other transformer terminal B via resistance 118, and a first parallel circuit including a neon indicating lamp 19 shunted by adjustable resistor 20, and a second parallel circuit including a choke coil 22 which is shunted by a neon indicating lamp 23. The voltage across terminals A, B is measured in terms of a unidirectional voltage using a rectifier 24, a filter capacitor 26 and a meter 25 having D.C. movement. One terminal of this series circuit 24, 25 is connected to terminal A and the other terminal of the series circuit is connected to terminal B via the parallel circuit 22, 23. Capacitor 26 shunts the meter 25.

The apparatus thus far described (with the resistor 118 short circuited and the probe 16 grounded as indicated by the ground 30 at point D) is found in commercial instruments used for testing of electrical apparatus for its capability to withstand high voltages.

In accordance with features of the present invention the circuit now described which includes also the previously described resistance 118 and other elements having a reference numeral in the 100 series may be used in combination with such existing commercially available instruments for achieving results of the present invention as now described.

The circuit 100 includes a transistor 101 connected in conventional emitter fashion which has its base electrode connected to the probe 15 via resistance 102. The emitter electrode is connected to point D and the collector electrode is connected to probe 16 via adjustable resistance 103. A D.C. measuring meter 104 is connected between the collector electrode and the point D. The meter 104 is protected using a first pair of series connected diodes 104a, 105 and a second pair of series connected diodes 106, 107, each pair being poled differently as shown.

The resistor 102 may have a value of megohms. The resistor 118 may have a value of 1,000 ohms and the transistor 101 may be of the 2N 4249 type.

It will be appreciated that the circuit 100 can be readily connected to existing instruments by connecting lead 110 to probe 15 and by inserting the resistance 118 between the grounded terminal 30 and the probe 16 as shown in FIG. 1. Alternatively the ground 30 may be removed and instead the probe 16 may be directly grounded. In either case the operation is essentially the same for all intents and purposes as will be described later.

Figure 2:
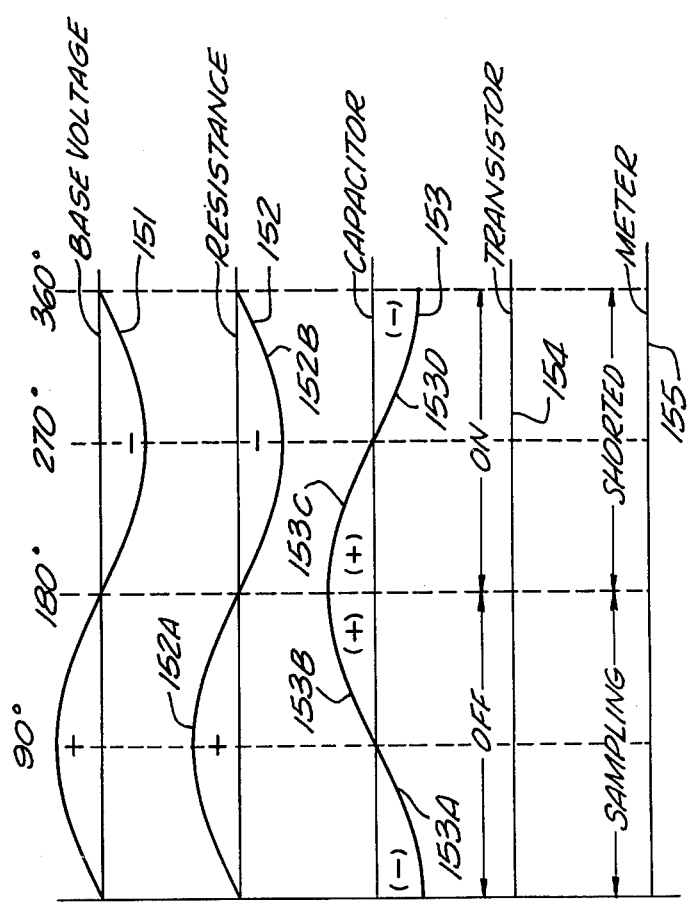
FIG. 2 illustrates three waveforms in time relationship and two different sets of related conditions useful for purposes of illustrating features of the present invention.

In FIG. 2 the waveform 151 is that of an A.C. voltage of the same frequency as the frequncy of source 10 and is that form which appears on the lead 110 or essentially at the base electrode of transistor 101.

The waveform 152 represents the waveform of the corresponding voltage which appears across a pure resistance R, free of any capacitive effects, when connected across the probes 15, 16. The voltage waveform 152 thus represents an in-phase condition.

The wavefore 153 is representative of a waveform which appears across the probe terminals 15, 16 when only a capacitor C is connected across such terminals 15, 16 and it will be seen that the waveform 153 "leads" the waveform 152 by 90 electrical degrees. The waveform 153 is thus representative of a so-called quadrature component.

The voltage applied to the transistor 101 results in the conditions illustrated at 154 and 155 in FIG. 2. As illustrated, the transistor 101 is in a so-called "off" or non-conducting condition for the first 180 electrical degrees and is later in time in an "on" or conducting condition during the remaining 180° of the full wave illustrated at 151. Correspondingly, on the same time base, the meter 104 during the first 180° samples the voltage between the probe electrodes 15, 16 and during the remaining 180° the meter 104 is effectively short circuited because the transistor 101 is conducting, i.e. is "on".

The meter 104 reads average D.C. values and it will be seen that when the condition illustrated at 152 prevails, i.e. only when Resistor R is connected to probes 15, 16, the meter 104 indicates a current flow representative of the average of the positive voltage 152 A and is rendered insensitive to the negative values of voltage 152 B by the "on" condition of transistor 101. In contrast, when the condition illustrated at 153 prevails, the meter 104 reads a minimum, i.e. substantially zero value, because the negative portion 153 A is effectively balanced out or averaged out by the positive portion 153 B during the "off" condition of transistor 101; and the positive and negative voltages 153 C and 153 D have no effect on the meter because during their occurrence the meter is short-circuited during the "on" condition of transistor 101.

Thus the transistor 101 acts as a switching device and in a sense as a demodulator and turns on and off at the same rate as the line frequency, i.e. 60 cycles per second.

Resistor 118 serves the purposes of limiting the base current of transistor 101 when it conducts.

Meter 104 may be adjusted by adjustable resistances (not shown) so that its full scale reading is produced by a current flow of 1,000 microamperes. Calibration may be accomplished using the 1,000 ohm resistor 118 which may be adjustable. The resistor 103 is adjusted to read whatever maximum leakage the in-phase meter is to register.

The transformer 11 may be of the high reactance type so designed that the output voltage on terminals 15, 16 collapses should the current output flow between probes 15, 16 exceed a predetermined magnitude thereby eliminating the necessity for a fuse or circuit breaker.

The neon lamp 23 connected across the choke 22 in the ground return lead is a "breakdown" indicator. An arcing failure of the equipment under test generates sufficient radio frequency energy to cause the lamp 23 to fire.

The lamp 19 is a so-called "leakage" lamp. When the current flow in the test circuit exceeds a certain flow, the voltage drop across the adjustable resistor 20 fires the neon lamp 19 to produce an indication of that condition.

While the particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of this invention.

I claim:

1. Circuitry for association with test probes of current leakage measuring apparatus utilizing an A.C. voltage power supply, said circuitry including a transistor having a base electrode, a collector electrode and an emitter electrode, means for connecting said base electrode to one of said probes, a meter connected between said collector electrode and said emitter electrode, a resistor connected in parallel with said meter, means for connecting said collector electrode to the other of said probes, and means adapted to connect said transistor to said power supply for rendering said transistor alternately conducting and nonconducting during succeeding half cycles of said A.C. voltage to cause said meter to measure only the component of the leakage current between said test probes as is in phase with said A.C. voltage.

2. In a test set having an A.C. voltage power supply for measuring true leakage current by nullifying the effect of capacitance on measured leakage current, said test set including a pair of test probes for connection to a test device, the improvement comprising
   a transistor having first, second and third electrodes,
   means for connecting said first electrode to one of said probes,
   a meter connected between said second and third electrodes,
   a resistor connected in parallel with said meter,
   means for connecting said second electrode to the other of said probes, and
   means adapted to connect said transistor to the power supply of said test set for causing said meter to measure the resistive component only of the leakage current across said test device.

3. The improvement of claim 2 wherein said transistor is a bipolar transistor.

4. The method of measuring the true leakage current of a test device by nullifying the effect of capacitive components of current, comprising the steps of
   applying an A.C. voltage across the base and the emitter of a transistor to enable the transistor to conduct only during alternate half-cycles of said A.C. voltage,
   placing a pair of probe means across the test device, one of said probe means being connected to the base of said transistor and the other probe means being connected to the collector of said transistor, and
   measuring the leakage current between said probe means with a meter connected between the collector and the emitter of said transistor to sample the leakage current only while said transistor is not conducting.

5. Circuity for association with test probes of current leakage measuring apparatus, said circuitry consisting of a single transistor having first, second and third electrodes, means for connecting said first electrode to one of said probes, a meter connected between said second and said third electrodes, a resistor connected in parallel with said meter, means for connecting said second electrode to the other of said probes, and means adapted to connect said transistor to an A.C. power supply for causing said meter to measure only the resistive component of the leakage current between said test probes.

6. Circuitry as in claim 5 wherein said means for connecting said first electrode to one of said probes includes a second resistor, and said means for connecting said second electrode to the other of said probes includes a third resistor.

7. Circuitry as in claim 5 wherein said transistor is a bipolar transistor.

8. In a test set having an A.C. voltage power supply for measuring true leakage current by nullifying the effect of capacitance on measured leakage current, said test set including a pair of test probes for connection to a test device, the improvement comprising a transistor having first, second and third electrodes means for connecting said first electrode between one terminal of the power supply of said test set and one of said probes, a meter connected between said second and third electrodes, a resistor connected in parallel with said meter, means for connecting said second electrode to the other of said probes, and means for connecting said third electrode to the other terminal of the power supply of said test set.

9. An A.C. voltage test set for measuring true leakage current by nullifying the effect of capacitance on measured leakage current, comprising an A.C. power supply, a pair of test probes, a transistor having first, second and third electrodes, means for connecting said first electrode to one of said probes, a meter connected between said second and third electrodes, means for connecting said second electrode to the other of said probes, and means for applying the A.C. voltage of said power supply to said transistor to enable said transistor to conduct only during alternate half-cycles of said A.C. voltage, so that said meter is operative to measure the resistive component only of the leakage current between said test probes.

* * * * *